US008659341B2

(12) United States Patent
Foley

(10) Patent No.: US 8,659,341 B2
(45) Date of Patent: Feb. 25, 2014

(54) SYSTEM AND METHOD FOR LEVEL-SHIFTING VOLTAGE SIGNALS USING A DYNAMIC LEVEL-SHIFTING ARCHITECTURE

(75) Inventor: David Foley, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 16 days.

(21) Appl. No.: 13/098,728

(22) Filed: May 2, 2011

(65) Prior Publication Data

US 2012/0280739 A1 Nov. 8, 2012

(51) Int. Cl.
*H03L 5/00* (2006.01)

(52) U.S. Cl.
USPC .................. 327/333; 326/62; 326/81

(58) Field of Classification Search
USPC ............... 326/62–63, 80–82; 327/306, 333
See application file for complete search history.

(56) References Cited

U.S. PATENT DOCUMENTS

| 5,212,474 | A | 5/1993 | Muhlemann |
| 5,896,045 | A | 4/1999 | Siegel et al. |
| 6,838,924 | B1 | 1/2005 | Davies, Jr. |
| 7,449,917 | B2 * | 11/2008 | Cheon ........................ 326/68 |
| 2003/0179032 | A1 | 9/2003 | Kaneko et al. |
| 2004/0232944 | A1 | 11/2004 | Bu et al. |
| 2005/0184757 | A1 | 8/2005 | Skroch |
| 2008/0191777 | A1 | 8/2008 | Lee et al. |
| 2009/0212842 | A1 | 8/2009 | Illegems et al. |
| 2011/0032019 | A1 | 2/2011 | Saether |
| 2011/0095804 | A1 | 4/2011 | Kumar et al. |

OTHER PUBLICATIONS

Analog Devices Inc., "CCD signal Processor with V-Driver and Precision Timing Generator", ADDI9005 Datasheet, Rev. Sp0, 84 pages, May 2010.
M. Khorasani et al., "Low-Power Static and Dynamic High-Voltage CMOS Level-Shifter Circuits", IEEE International Symposium on Circuits and Systems, May 18-21, 2008, (ISCAS 2008), pp. 1946-1949.
International Search Report and Written Opinion of the International Searching Authority in counterpart International Application No. PCT/US2012/035936, report dated Aug. 10, 2012.

* cited by examiner

*Primary Examiner* — Dinh T. Le
(74) *Attorney, Agent, or Firm* — Kenyon & Kenyon, LLP

(57) ABSTRACT

A system and method to level-shift multiple signals from a first voltage domain to a second voltage domain with minimized silicon area. A level-shifting system may be organized by implementing a static level-shifter coupled to a plurality of dynamic level-shifters. The static level-shifter may provide a voltage control signal for each of the dynamic level-shifters. Each of the dynamic level-shifters may level-shift an individual input signal from a first voltage domain to a second voltage domain.

15 Claims, 4 Drawing Sheets

100

200

300

400

SYSTEM AND METHOD FOR LEVEL-SHIFTING VOLTAGE SIGNALS USING A DYNAMIC LEVEL-SHIFTING ARCHITECTURE

BACKGROUND

Voltage level-shifting circuits provide interfaces between circuit systems at two different voltage domains. Different voltage domains are often necessary for consumer electronic integrated circuit systems. A first integrated circuit may be embodied, for example, as a digital controller that carries digital voltage signals that vary between a first set of voltages, for example, ground (0V) and 1.8V. A second integrated circuit may be embodied as a charge coupled device (CCD) and may require discrete operating voltage signals that vary between a second set of voltages, for example, −8V and 15V. A level-shifting circuit may convert signals from the domain of the first integrated circuit to the domain of the second integrated circuit.

Level-shifting circuits have been used to perform voltage conversion between such domains. In one application, the level-shifting circuit may be implemented as a two-stage circuit to accomplish the conversion between a 0V to 1.8V range and a −8V to 15V range. A first stage converts the input range to an intermediate 0V to 15V range, and then a second stage converts the intermediate range to a final −8V to 15V range.

The two-stage implementation has been accomplished using static level shifter circuits, which are area intensive. As the magnitudes of the voltage ranges diverge, devices within the level-shifters must become larger, which increases the silicon area consumed by such devices. Further, the known implementations employ a separate level shifter circuit for each output signal line extending between the two domains. As system designs evolve and the number of interface signals increase, the area consumption issue scales in kind.

Accordingly, there is a need in the art for a level-shifter system that converts signals from a low voltage domain to a high voltage domain and minimizes area.

DETAILED DESCRIPTION

Embodiments of the present invention provide techniques to level-shift multiple signals from a first voltage domain to a second voltage domain with conserved silicon area. According to such embodiments, a level-shifting system may be organized by implementing a static level-shifter coupled to a plurality of dynamic level-shifters. The static level-shifter may provide a voltage control signal for each of the dynamic level-shifters. Each of the dynamic level-shifters may level-shift an individual input signal from a first voltage domain to a second voltage domain. The silicon area necessary to implement a static level-shifter coupled to a plurality of dynamic level-shifters may be less than the area required to implement a plurality of two-stage static level-shifters.

Figure 1:
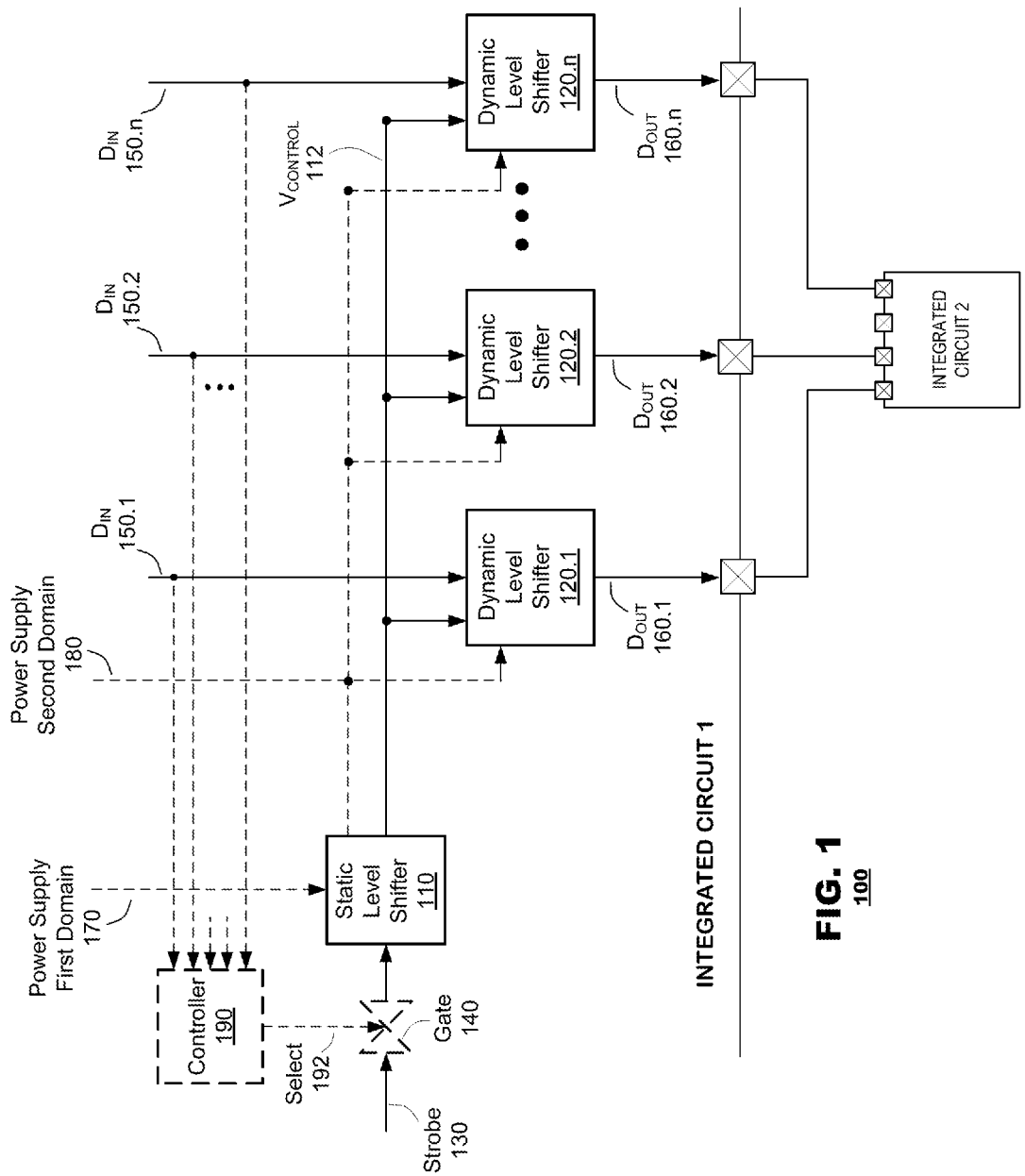
FIG. 1 illustrates a block diagram of a level-shifter system according to an embodiment of the present invention.

FIG. 1 illustrates a block diagram of a level-shifter system 100 according to an embodiment of the present invention. The system 100 may find application to shift a plurality of input data signals $D_{IN}$ (150.1-150.n) from a first voltage domain to a second voltage domain. As illustrated in FIG. 1, the system 100 may include a static level-shifter 110 and a plurality of dynamic level-shifters 120.1-120.n. The dynamic level shifters 120.1-120.n each may have an input for a respective input data signal $D_{IN}$ 150.1-150.n and an output for a respective level-shifted output data signal $D_{OUT}$ 160.1-160.n. The output data signals may be coupled to output pins of the integrated circuit in which the system 100 resides. The static level shifter 110 may upconvert an input strobe signal from the first voltage domain to the second voltage domain, which may be input to the dynamic level shifters 120.1-120.n in common and govern their operation.

In an embodiment, the static level-shifter 110 may receive operational power from power supplies of the first and second voltage domains 170, 180 (i.e., 0V to 1.8V and −8V to 15V). The dynamic level-shifters 120.1-120.n may receive operational power from a power supply 180 of the second domain.

The static level-shifter 110 may receive a strobe signal 130 that varies within the first voltage domain and may generate an output strobe (illustrated as $V_{CONTROL}$ 112) that varies within the second voltage domain. The $V_{CONTROL}$ 112 strobe may control operation of the dynamic level-shifters 120.1-120.n to determine when the dynamic level-shifters 120.1-120.n may change their output state. In one state, called the "reset" state, the $V_{CONTROL}$ 112 strobe may reset operation of the dynamic level-shifters 120.1-120.n. During this time, the dynamic level-shifters 120.1-120.n may output invalid data. In another "active" state, the $V_{CONTROL}$ 112 strobe may activate the dynamic level-shifters 120.1-120.n to upconvert input data signals 150.1-150.n from the first voltage domain to output data signals 160.1-160.n in the second voltage domain. The strobe signal 130 may act as a clock signal to the system 100 that defines a rate at which new data may be output therefrom.

The system 100 may find application in circuit systems in which integrated circuits operate in different voltage domains. For example, FIG. 1 illustrates the system 100 as provided in a first integrated circuit and providing outputs to a second integrated circuit. In such applications, the first integrated circuit may process data using other circuit systems (not shown) that operate in the first voltage domain. The second integrated circuit may process data using circuit systems (also not shown) that operate in the second voltage domain. By way of example, the first integrated circuit may be a CCD driver, which may operate at a voltage domain of 0 V and 1.8V, and the second integrated circuit may be a CCD (charge coupled device) image sensor, which may operate at a voltage of −8V and 15V. In this manner, the level shifter system 100 may shift control signals from the first voltage domain to the second voltage domain and output them from the first integrated circuit via pins. The shifted control signals may be input to the second integrated circuit via corresponding pins.

The system 100 may find use in some applications where the content of data to be output from the integrated circuit may not change at the rate of an input strobe 130. For example, in a CCD application, the system 100 may output control data to the second integrated circuit which can be expected to persist for an extended period of time as measured against a rate of the strobe signal 130. In an embodiment, the system may include a gate 140 and a controller 190. The controller 190 may determine whether content of the input data $D_{IN}$ 150.1-150.n is changing. If the content of the input data $D_{IN}$ 150.1-150.n remains static from one strobe cycle to the next, the controller 190 may cause the gate 140 to inhibit the strobe signal 130 before it is received by the static level shifter 110. Inhibiting operation of the strobe signal 130 may prevent the dynamic level shifters 120.1-120.n from consuming power that otherwise would be spent transitioning to a reset state and back to an active state that outputs identical data to the output pins.

Figure 2:
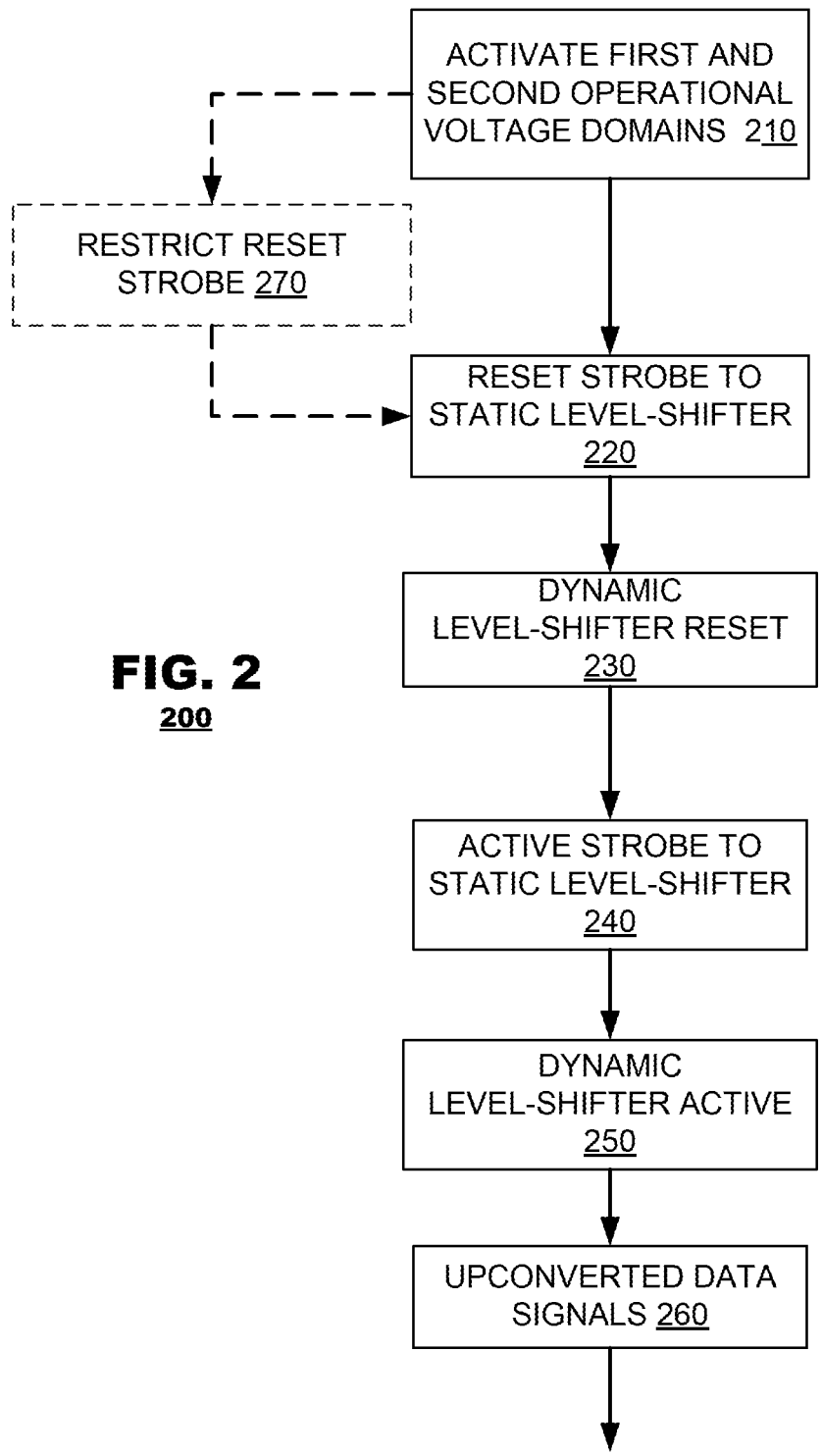
FIG. 2 illustrates a method for level-shifting an input signal from a first voltage domain to a second voltage domain according to an embodiment of the present invention.

FIG. 2 illustrates a method for level-shifting an input signal from a first voltage domain to a second voltage domain using a level-shifter system according to an embodiment of the present invention. As illustrated in block 210, a first and second operational voltage domain may be activated as power supplies for the level-shifter system. A reset strobe within the first voltage domain may be input to the static level-shifter and the static level-shifter may generate a reset strobe within the second voltage domain therefrom that may be applied to each of a plurality of dynamic level-shifters in common (block 220). Each of the plurality of dynamic level-shifters may reset their operation in response to the reset strobe (block 230). A second active strobe from the first voltage domain may then be input to the static level-shifter and the static level shifter may generate an active strobe within the second voltage domain therefrom that may be applied to each of the plurality of dynamic level-shifters (block 240). Each of the plurality of dynamic level shifters may enter active operation and operate to upconvert an input data signal from the first voltage domain (block 250). Each of the dynamic level-shifters may output a data signal within the second voltage domain (block 260). In an embodiment, if none of the data signals are dynamic, then the reset strobe may be restricted from being input to the static level-shifter (block 270).

Figure 3:
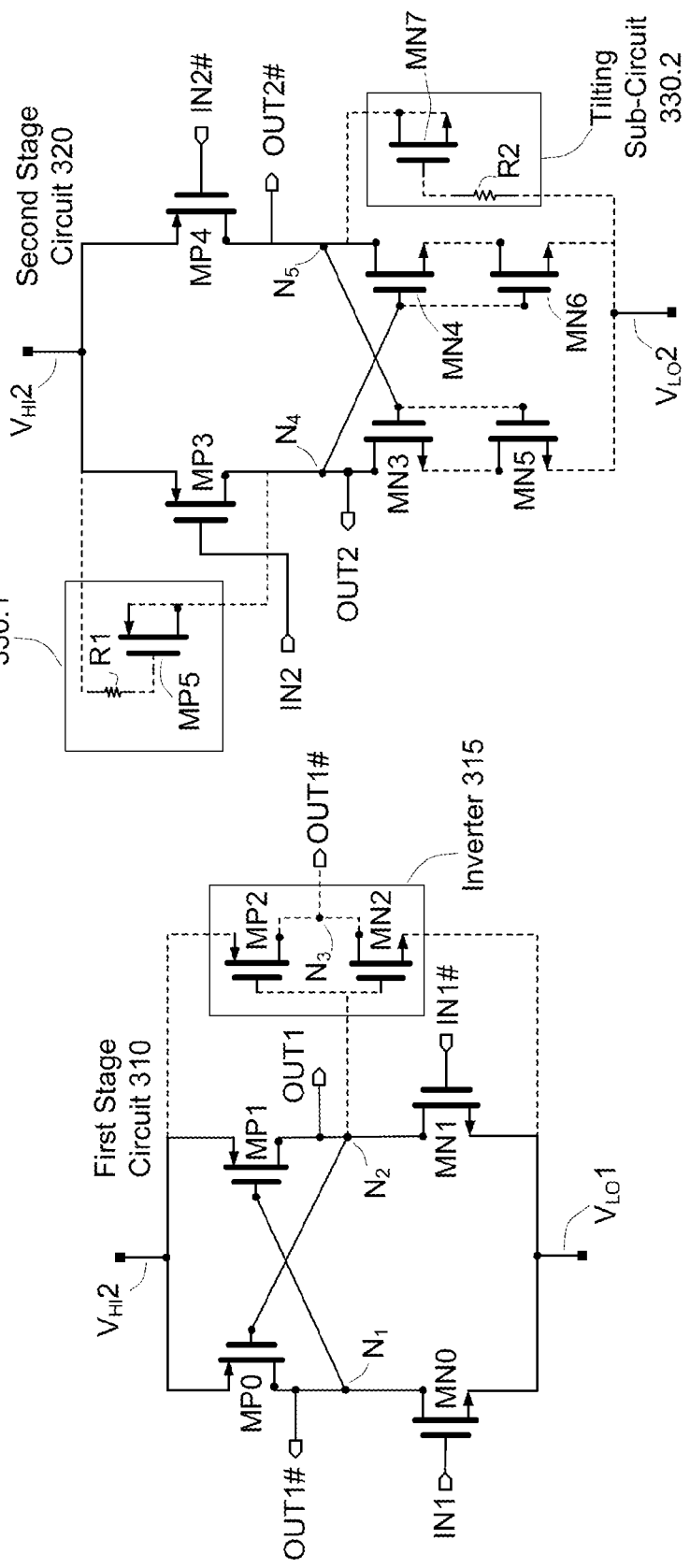
FIG. 3 describes a circuit diagram illustrating an exemplary static level-shifter design suitable for use with a level-shifter system of the foregoing embodiments.

FIG. 3 illustrates a static level-shifter circuit 300 according to an embodiment of the present invention. The static level-shifter 300 may include a first stage circuit 310 and a second stage circuit 320. Both the first stage circuit 310 and the second stage circuit 320 may be configured as voltage level-shifters. The first stage circuit may perform a first step of conversion between the two voltage domains by converting high voltage components of the input signal. As such, the first stage may be coupled to a source supply of the second voltage domain $V_{HI}2$ and to a drain supply of the first voltage domain $V_{LO}1$. The second stage circuit 320 may perform a second step of conversion by converting low voltage components of the input signal. As such, the second stage 320 may be coupled to the source supply of the second voltage domain $V_{HI}2$ and to the drain supply of the second voltage domain $V_{LO}2$.

The first stage circuit 310 may include a pair of circuit paths extending between respective supplies. Each circuit path may include respective PMOS transistors MP0 and MP1 and respective NMOS transistors MN0 and MN1. Gates of each NMOS transistor MN0, MN1 may be coupled to one of the differential input signals IN1, IN1#. Gates of each PMOS transistor may be coupled to an intermediate node formed between the transistors of the opposing circuit path (e.g., the gate of MP0 may be coupled to the intermediate node $N_2$). Output terminals OUT1, OUT1# may be connected respectively to intermediate nodes $N_1$, $N_2$ between the PMOS and NMOS transistors of each circuit path. As noted, the first and second circuit paths may extend from one supply of the first voltage domain ($V_{LO}1$ in this example) to a supply of the second voltage domain, $V_{HI}2$. Outputs from the first stage circuit 310, therefore, may vary between one rail voltage of the first voltage domain ($V_{LO}1$) and a rail of the second voltage domain ($V_{HI}2$).

During operation, the differential input signal IN, IN# may be applied to the NMOS transistors, which causes one of the transistors (say, MN0) to become conductive. The counterpart NMOS transistor remains non-conductive. In response, a voltage at node N1 may discharge to $V_{LO}1$, which may cause the PMOS transistor in the opposite circuit path (MP1) to become conductive. When the PMOS transistor MP1 becomes conductive, a voltage at node N2 may rise to $V_{HI}2$. The rising voltage at $V_{HI}2$ may clamp the PMOS transistor MP0 in the opposite circuit path in a non-conductive state. Nodes N1 and N2, therefore, generate a differential output signal OUT1, OUT1# to the next circuit stage 320.

The second stage circuit 320 also may be configured with a pair of cross-coupled circuit paths extending between respective supplies. Each circuit path may include respective PMOS transistors MP3 and MP4 and respective NMOS transistors MN3 and MN4. Gates of each respective NMOS transistor MN3 and MN4 may be coupled to an intermediate node $N_4$ or $N_5$ formed between the transistors of the opposing circuit path (e.g., the MN3 gate may be coupled to the intermediate node $N_4$). Gates of the PMOS transistors may be coupled respectively to output terminals from the first circuit stage 310. Output terminals from the second circuit stage 320 may be coupled respectively to the intermediate notes $N_4$, $N_5$. Similarly, the first and second circuit paths may extend from one supply of the second voltage domain ($V_{LO}2$ in this example) to a supply of the second voltage domain, $V_{HI}2$. Outputs from the second stage circuit, therefore, may vary between both rail voltages of the second domain ($V_{LO}2$ and $V_{HI}2$).

During operation, a differential input signal IN2, IN2# may be applied to the second circuit stage 320 from the first stage 310. The input signal may cause one of the PMOS transistors (say, MP4) to become conductive. The counterpart PMOS transistor MP3 remains non-conductive. In response, a voltage at node $N_5$ may charge to $V_{HI}2$, which may cause the NMOS transistor in the opposite circuit path (MN3) to become conductive. When the NMOS transistor MN3 becomes conductive, a voltage at node $N_4$ may discharge to $V_{LO}2$. The discharging voltage at node $N_4$ may clamp the NMOS transistor MN4 in the opposite circuit path in a non-conductive state. Nodes $N_4$ and $N_5$, therefore, generate a differential output signal OUT2, OUT2# from the second circuit stage 320.

Optionally, the first stage 310 may include an inverter 315 formed by transistors MP2 and MN2. In this embodiment, the OUT1# output may be taken from a node $N_3$ formed between these transistors MP2, MN2 rather than from node $N_1$. Gates of the transistors MP2, MN2 may be coupled to the OUT1 terminal (node $N_2$).

During operation, as described above, when differential input signals are input to the first circuit stage 310, differential voltages are established at nodes $N_1$ and $N_2$. A voltage at node $N_2$ may drive transistors MP2, MN2 of the inverter 315, which may establish a voltage at node $N_3$ that is a complement to the voltage at node $N_2$. A differential output signal, therefore, may be output from the first circuit stage 310 from nodes $N_2$ and $N_3$. The voltage at node $N_2$, however, because it drives the inverter 315, may become stable at an earlier time than the voltage at node $N_3$ may be established. When the output signals OUT1, OUT1# may be input to the second circuit stage 320, this latency may reduce opportunities for glitches and other abnormalities that might arise if the OUT1, OUT1# signals were generated simultaneously. Thus, the inverter 315 may enhance operational stability of the level shifter 300.

Optionally, the second circuit stage 320 may include a pair of tilting sub-circuits to drive the output terminals OUT2, OUT2# in the absence of active input data from the first stage 310. A first tilting sub-circuit 330.1 may include a transistor MP5 its gate coupled to $V_{HI}2$ via a resistor R1. A source and drain of transistor MP5 may be coupled to the output node $N_4$. Similarly, the second sub-tilting circuit 330.2 may include a transistor MN7 having its gate coupled to $V_{LO}2$ via another resistor R2. A source and drain of transistor MN7 may be coupled to the output node $N_5$.

The tilting sub-circuits 330.1, 330.2 may stabilize outputs of the static level shifter during power-up operations. During system power-up, the first tilting sub-circuit 330.1 may bias the intermediate node $N_4$ with a predetermined voltage, which may prevent the output signal OUT2 from floating. This may be achieved by shorting the source and drain connections of MP5 which, in effect, may cause MP5 to behave like a capacitor in the circuit. Thus, a small bias voltage may be applied at intermediate node $N_4$. During power-up, however, a small bias current may flow through the device and apply a desired bias voltage at intermediate node $N_4$. A similar design and operation may follow for the second tilting sub-circuit 330.2 implemented with transistor MN7 at the intermediate node $N_5$ that may keep OUT2# from floating during power-up.

The second stage circuit 320 may further include cross-coupled NMOS transistors MN5 and MN6 connected in series between respective transistors MN3 and MN4 and the drain supply rail $V_{LO}2$. The MN5 and MN6 gates may be coupled respectively to intermediate nodes N4 and N5. During circuit operation, transistors MN5 and MN6 may serve to reduce the strength of the circuit output and the size of transistors MP3 and MP4.

According to this operation, transistors MN0 and MN1 may be termed "drive" transistors and MP0 and MP1 may be termed "load" transistors within the first stage circuit 310. Similarly, transistors MP3 and MP4 may be drive transistors and transistors MN3 and MN4 may be load transistors within the second stage circuit 320. The drive/load nomenclature may indicate a relationship wherein a drive transistor may be configured to switch a load transistor to a conductive state during operation.

To shift a first stage circuit input from a low voltage to a high voltage, the drive transistors MN0 and MN1 may be much larger in relative silicon size than their load transistor counterparts MP0 and MP1. To switch a load transistor to a conductive state, a certain gate threshold voltage must be overcome. Overcoming this gate threshold voltage for a load transistor is a function of both the supply voltages and relative size differences between a load and drive transistor. When the load transistor supply voltage (e.g., $V_{HI}2$ for MP1) may be orders of magnitude larger than the drive transistor supply voltage (e.g., $V_{LO}2$ for MN0), the drive transistor may be orders of magnitude larger than the load transistor to drive the load transistor gate past its threshold voltage. Thus, level-shifting a large number of low voltage input signals to high voltage output signals may inefficiently consume a large silicon area of a microchip or integrated circuit.

Static level shifters 300 illustrated in the foregoing embodiments may find application as the static level shifter 110 of FIG. 1.

Figure 4:
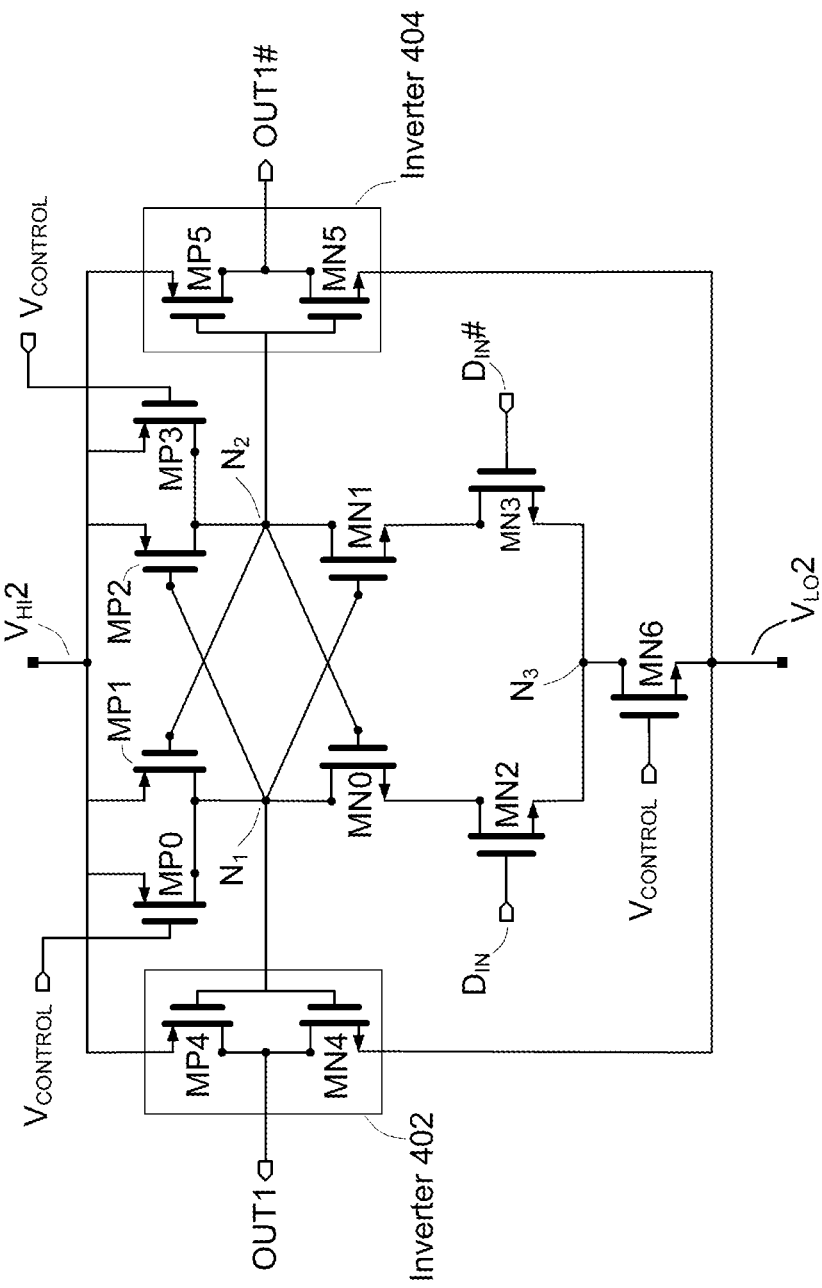
FIG. 4 describes a circuit diagram illustrating an exemplary dynamic level-shifter design suitable for use a level-shifter system of the foregoing embodiments.

FIG. 4 is a circuit diagram of a dynamic level-shifter 400 according to an embodiment of the present invention. The dynamic level-shifter 400 may perform a conversion between two voltage domains by converting both the high and low voltage components of an input signal (e.g., 1.8V to 15V and 0V to −8V). As such, the dynamic level-shifter 400 may be coupled to the source and drain supply of the second voltage domain ($V_{HI}2$ and $V_{LO}2$).

The dynamic level-shifter 400 may include a plurality of circuit paths extending between the respective supplies. A pair of circuit paths each may include a pair of PMOS transistor MP0 and MP1, MP2 and MP3 and a pair of NMOS transistors MN0 and MN2, or MN1 and MN3. The PMOS pairs may be connected in parallel between a voltage supply of the second voltage domain ($V_{HI}2$) and an intermediate node $N_1$, $N_2$ in the respective path. The gates of one PMOS transistor MP1, MP2 in each path may be coupled to the intermediate node $N_1$, $N_2$ of the other path (e.g., the gate of MP1 may be coupled to the intermediate node $N_2$). Gates of the other PMOS transistor MP0, MP3 may be coupled to the strobe signal $V_{CONTROL}$.

The NMOS transistors in each path may be coupled in series between the intermediate node of the path $N_1$, $N_2$ and a third node $N_3$ that is common to both paths. Gates of one of the NMOS transistors MN0 and MN1 in each path may be coupled to the intermediate node $N_1$, $N_2$ of the other path. Gates of the other NMOS transistor MN2, MN3 of each path may receive a respective differential input signal IN1 or IN1#. In this sense, the transistors pairs MN0|MP1 and MN1|MP2 are configured as inverters to invert the signals present at intermediate nodes $N_1$, $N_2$ of the counterpart signal path. A final NMOS transistor MN6 may be coupled between node $N_3$ and another supply of the second voltage domain ($V_{LO}2$ in this example). A gate of transistor MN6 may be coupled to the strobe signal $V_{CONTROL}$.

The dynamic level shifter 400 may include other circuit paths, including a pair of inverters 402, 404, each including a PMOS transistor (MP4, MP5) and an NMOS transistor (MN4, MN5) coupled in series. Gates of these inverter transistors may be coupled to respective intermediate nodes N1, N2 of the first two circuit paths. Output terminals of the dynamic level shifter 400 may be taken from intermediate nodes between the PMOS and NMOS transistors. In this manner, the output signals from the dynamic level shifters (OUT1, OUT1#) will be inversions of the voltages generated at the intermediate nodes N1, N2.

The dynamic level-shifter 400 may progress through two phase of operation: a reset state and an active state. In the reset state, the dynamic level-shifter 400 may output invalid data signals present on data outputs OUT1 and OUT1#. In the active state, the dynamic level-shifter 400 may operate to upconvert signals from a first voltage domain present on the dynamic level-shifter data inputs, IN1 and IN1#, to a second voltage domain present on the output data signals OUT1 and OUT1#.

During the reset state, the control signal $V_{CONTROL}$ may be applied to transistors MP0 and MP3 may cause these transistors to switch on. Thus, nodes $N_1$ and $N_2$ may be driven to the $V_{HI}2$ voltage. The gates of transistors MP2 and MN1 gate may be driven to the $V_{HI}2$ voltage via the intermediate node $N_1$. Transistor MP2 may be driven to be non-conductive, while the transistor MN1 may be driven to be conductive. Switching transistor MN1 to be conductive may cause the $V_{HI}2$ voltage to propagate further along the second path to the source of transistor MN3. Similarly, the $V_{HI}2$ voltage may be applied to node $N_2$ via transistor MP3 and further to the gates of MP1 and MN0. MP1 may be driven to a non-conductive state and MN0 may be driven to a conductive state in a similar manner. The $V_{HI}2$ voltage may be developed on the source of transistor MN2. Thus, the $V_{HI}2$ voltage may be developed at nodes $N_1$, $N_2$ during the reset state, which may drive voltages at the output terminals OUT1, OUT1# to $V_{LO}2$.

During the active state, the $V_{CONTROL}$ input may change, which renders MP0 and MP1 non-conductive and MN6 conductive. Additionally, active data IN1, IN1# may be applied at the gates of transistors MN2 and MN3. The input data signals may be provided from the first voltage domain. In response, transistors MN2 and MN3 may become conductive. When MN2 begins to conduct, the intermediate node $N_1$ in its circuit path may begin to discharge to $V_{LO}2$. Similarly, when MN3 begins to conduct, the intermediate node $N_2$ in its circuit path may also begin discharge to $V_{LO}2$. The rate at which each path may discharge may be determined by the voltages applied respectively to MN2 and MN3. A higher voltage applied to MN3 rather than MN2 may cause the second path to discharge fast than the first path. As a result, voltages at the gates of transistors MP1 and MN0 of the counterpart circuit path also may discharge faster to $V_{LO}2$, which may cause transistor MP1 to become conductive but MN0 to become non-conductive. In turn, the voltage at the intermediate node $N_1$ may be clamped to $V_{HI}2$. The inverters 402, 404 may generate output signals OUT1, OUT1# that may invert the voltages present at nodes $N_1$ and $N_2$. In the foregoing example, OUT1# may be set to $V_{HI}2$ because the voltage $V_{LO}2$ may be present at node $N_2$ and OUT1 may be set to $V_{LO}2$ because the voltage $V_{HI}2$ may be present at node $N_1$.

The dynamic level-shifter operation 400 differs from the static level-shifter operation in that no drive transistors are required for the dynamic level-shifter 400 operation. Instead, the voltage control input $V_{CONTROL}$ may cause transistors MP0, MP1, and MN6 to become conductive and apply the second domain supply voltages to the first and second path. Through this operation, the dynamic level-shifter 400 may exploit the supply voltages to control transistor switching operations within the circuit. Compared with the static level-shifter, no single transistor within the dynamic level-shifter circuit may be tasked with driving the threshold gate voltage of another load transistor rather the supply voltages, and $V_{CONTROL}$ may control transistor switching. Thus, the transistors within the circuit may be relatively equal in silicon size. This operation characteristic may allow for a dynamic level-shifter system that utilizes less silicon area to level shift a large number of low voltage input signals than a similarly situated system implemented with a large number of static level-shifter circuits.

As illustrated, FIG. 4 shows both circuit paths extending across a common control transistor MN6 before connection to the low voltage supply $V_{LO}2$. In another embodiment, the circuit paths may be provided with their own separate control transistors (not shown) both connected to $V_{CONTROL}$. This embodiment, however, incurs the cost of additional components over the embodiment illustrated in FIG. 4.

Several embodiments of the present invention are specifically illustrated and described herein. However, it will be appreciated that modifications and variations of the present invention are covered by the above teachings and within the purview of the appended claims without departing from the spirit and intended scope of the invention. Each of a respective NMOS or PMOS transistor type in any of the foregoing circuits may be interchanged with a respective PMOS or NMOS transistor while inverting the voltage rails of a circuit to achieve level-shifting within the scope and teachings of the present invention.

I claim:

1. A voltage shifting data transmission system, comprising:
   a static level-shifter having an input for a control signal within a first voltage domain and an output for a signal representing a strobe signal shifted to a second voltage domain;
   a plurality of dynamic level-shifters, each having a first input coupled to the shifted strobe signal, a second input for a respective data signal within the first voltage domain, and an output for a signal representing the respective data signal shifted to the second voltage domain; and
   an activity detector coupled to the data signals of the first voltage domain to block transition of the shifted strobe signal from the static level-shifter when the data signals are static.

2. The system of claim 1, wherein the dynamic level-shifters have a reset phase and an active phase, the dynamic level-shifters outputting the shifted data signals during the active phase.

3. The system of claim 1, wherein the static level shifter comprises:
   a first stage of cross-coupled transistor circuit paths extending between a supply of the first voltage domain and a supply of the second voltage domain, each path including a transistor that is coupled to one of a differential pair of strobe signal, and
   a second stage of cross-coupled transistor circuit paths extending between supplies of the second voltage domain, each path including a transistor that is coupled to a respective one of the circuit paths of the first stage.

4. The system of claim 1, wherein the static level shifter comprises:
   a first stage of cross-coupled transistor circuit paths extending between a supply of the first voltage domain and a supply of the second voltage domain, each path including a transistor that is coupled to one of a differential pair of strobe signal,
   an inverter, having an input coupled to a first circuit path from the first stage, and
   a second stage of cross-coupled transistor circuit paths extending between supplies of the second voltage domain, a first path including a transistor that is coupled to an output of the inverter and a second path including a transistor that is coupled to a second path of the first stage.

5. The system of claim 1, wherein at least one dynamic level shifter comprises a first pair of cross-coupled circuit paths extending between supplies of the second voltage domain, each circuit path including:
   a data transistor having an input for one of a differential pair of data signals in the first voltage domain,
   a pair of transistors connected as an inverter and having inputs coupled to an intermediate node of the other circuit path,
   a first control transistor having a source to drain path extending between a first supply and the intermediate node of the circuit path and having an input coupled to the shifted strobe signal, and
   a second control transistor having a source to drain path extending between a second supply and the data transistor and having an input coupled to the shifted strobe signal.

6. The system of claim 1, wherein at least one dynamic level shifter comprises
 a first pair of cross-coupled circuit paths extending between supplies of the second voltage domain, each circuit path including:
  a data transistor having an input for one of a differential pair of data signals in the first voltage domain,
  a pair of transistors connected as an inverter and having inputs coupled to an intermediate node of the other circuit path, and
  a first control transistor having a source to drain path extending between a first supply and the intermediate node of the circuit path and having an input coupled to the shifted strobe signal; and
 another control transistor having a source to drain path extending between a second supply and the data transistors of both circuit paths and having an input coupled to the shifted strobe signal.

7. The system of claim 1, wherein outputs of the dynamic level shifters are directly coupled to output pins of an integrated circuit.

8. A circuit system, comprising:
 a first integrated circuit having outputs coupled to the control inputs of a second integrated circuit and having internal processing logic operable in a first voltage domain, the first integrated circuit having an output system that comprises:
  a static level-shifter having an input for a strobe signal within the first voltage domain and an output for a signal representing the strobe signal shifted to the second voltage domain;
  a plurality of dynamic level-shifters, each having a first input coupled to the shifted strobe signal, a second input for a respective data signal within the first voltage domain, and an output for a signal representing the respective data signal shifted to the second voltage domain; and
  an activity detector coupled to the data signals of the first voltage domain to block transition of the shifted strobe signal from the static level-shifter when the data signals are static;
 wherein the second integrated circuit having inputs for a plurality of data signals, the inputs operable in the second voltage domain.

9. The system of claim 8, wherein the static level shifter comprises:
 a first stage of cross-coupled transistor circuit paths extending between a supply of the second voltage domain and a supply of the first voltage domain, each path including a transistor that is coupled to one of a differential pair of strobe signal, and
 a second stage of cross-coupled transistor circuit paths extending between supplies of the first voltage domain, each path including a transistor that is coupled to a respective one of the circuit paths of the first stage.

10. The system of claim 8, wherein the static level shifter comprises:
 a first stage of cross-coupled transistor circuit paths extending between a supply of the second voltage domain and a supply of the first voltage domain, each path including a transistor that is coupled to one of a differential pair of strobe signal,
 an inverter, having an input coupled to a first circuit path from the first stage, and
 a second stage of cross-coupled transistor circuit paths extending between supplies of the first voltage domain,
  a first path including a transistor that is coupled to an output of the inverter and a second path including a transistor that is coupled to a second path of the first stage.

11. The system of claim 8, wherein at least one dynamic level shifter comprises a first pair of cross-coupled circuit paths extending between supplies of the first voltage domain, each circuit path including:
 a data transistor having an input for one of a differential pair of data signals in the first voltage domain;
 a pair of transistors connected as an inverter and having inputs coupled to an intermediate node of the other circuit path,
 a first control transistor having a source to drain path extending between a first supply and the intermediate node of the circuit path and having an input coupled to the shifted strobe signal, and
 a second control transistor having a source to drain path extending between a second supply and the data transistor and having an input coupled to the shifted strobe signal.

12. The system of claim 8, wherein at least one dynamic level shifter comprises
 a first pair of cross-coupled circuit paths extending between supplies of the first voltage domain, each circuit path including:
  a data transistor having an input for one of a differential pair of data signals in the first voltage domain;
  a pair of transistors connected as an inverter and having inputs coupled to an intermediate node of the other circuit path, and
  a first control transistor having a source to drain path extending between a first supply and the intermediate node of the circuit path and having an input coupled to the shifted strobe signal; and
 another control transistor having a source to drain path extending between a second supply and the data transistors of both circuit paths and having an input coupled to the shifted strobe signal.

13. The system of claim 8, wherein outputs of the dynamic level shifters are directly coupled to output pins of the second integrated circuit.

14. A method of converting data signals from a first voltage domain to a second voltage domain, comprising:
 shifting a control strobe from the first voltage domain to the second voltage domain,
 during a reset period of the control strobe, resetting a plurality of dynamic level shifters,
 during an active period of the control strobe, shifting data signals input to the dynamic levels shifters from the first voltage domain to the second voltage domain,
 determining whether data signals input to the dynamic level shifters have changed between a first active period and a second active period, and
 if the data signals have not changed, blocking propagation of a reset period of the control strobe.

15. The method of claim 14, wherein the shifting of the control strobe comprises shifting the strobe through a pair of stages:
 a first stage shifting a first voltage limit of the input strobe from the first domain to the second voltage domain, and,
 a second stage shifting a second voltage limit of the input strobe from the first domain to the second domain.

* * * * *